United States Patent [19]

Chen et al.

[11] Patent Number: 5,304,839
[45] Date of Patent: Apr. 19, 1994

[54] BIPOLAR ESD PROTECTION FOR INTEGRATED CIRCUITS

[75] Inventors: Che-Tsung Chen, Allentown; Thaddeus J. Gabara, North Whitehall Township, Lehigh County; Bernard L. Morris, Allentown; Yehuda Smooha, South Whitehall Township, Lehigh County, all of Pa.

[73] Assignee: AT&T Bell Laboratories, Murray Hill, N.J.

[21] Appl. No.: 847,438

[22] Filed: Mar. 6, 1992

Related U.S. Application Data

[63] Continuation of Ser. No. 623,876, Dec. 4, 1990, abandoned.

[51] Int. Cl.⁵ ............... H01L 29/06; H01L 29/78; H01L 29/72; H01L 29/02
[52] U.S. Cl. ............... 257/546; 257/355; 257/362; 257/363; 257/566; 257/577
[58] Field of Search ............... 357/23.13; 257/355, 257/360, 362, 363, 546, 566, 577, 356

[56] References Cited

U.S. PATENT DOCUMENTS

| | | | |
|---|---|---|---|
| 4,806,999 | 2/1989 | Strauss | 357/23.13 |
| 4,814,853 | 3/1989 | Uchida | 357/51 |
| 4,821,089 | 4/1989 | Strauss | 357/68 |
| 4,994,874 | 2/1991 | Shimizu et al. | 357/23.13 |
| 5,072,273 | 12/1991 | Avery | 357/23.13 |
| 5,138,413 | 9/1992 | Grosset et al. | 257/50 |

FOREIGN PATENT DOCUMENTS 3626394 12/1986 Fed. Rep. of Germany.

Primary Examiner—J. Carroll
Attorney, Agent, or Firm—James H. Fox

[57] ABSTRACT

CMOS integrated circuit buffers typically use a dual-diode electrostatic discharge (ESD) protection technique. However, in some cases that technique inadvertently causes one of the diodes to conduct when a desired signal voltage is present on the bondpad, thereby clipping the desired signal. This occurs, for example, when an output buffer on an unpowered device is connected to an active bus, or when the input buffer of a 3 volt device receives a 5 volt signal. The present invention solves this problem by using a bipolar (e.g., pnp) protection transistor connected between the bondpad and a power supply bus (e.g., $V_{SS}$). The base of the transistor is connected to the bondpad through a resistor that provides a time delay due to the R-C time constant that includes distributed capacitance. The time delay allows for a high conduction period, during which an ESD event is conducted through the bipolar transistor, thereby protecting the input or output buffer.

3 Claims, 1 Drawing Sheet

BIPOLAR ESD PROTECTION FOR INTEGRATED CIRCUITS

This application is a continuation of application Ser. No. 07/623,876, filed on Dec. 4, 1990, abandoned.

BACKGROUND OF THE INVENTION

1. Field of the Invention

The present invention relates to integrated circuits having improved protection from electrostatic discharge.

2. Description of the Prior Art

The protection of integrated circuits (ICs) from electrostatic discharge (ESD) events is a significant part of integrated circuit design. A typical protection circuit may include diodes and/or transistors that are connected between the input or output bondpads and a power supply conductor ($V_{SS}$ or $V_{DD}$). A ESD voltage on the bondpad (e.g., greater than 100 volts) is then conducted safely away from the operational circuitry (typically an input buffer or output buffer) that is connected to the bondpad. For example, referring to FIG. 3, protection diode 32 conducts when the voltage on bondpad 31 exceeds a diode threshold voltage drop (about 0.6 volts) above the voltage on the power supply conductor 35, which in operation is connected to the positive power supply voltage ($V_{DD}$). Similarly, protection diode 33 conducts when the voltage on the bondpad falls sufficiently below the voltage on the power supply conductor 36, which in operation is connected to the negative power supply voltage ($V_{SS}$). Most ESD problems occur during shipping and handling, when the power supply voltages are not applied to the IC chip. However, the capacitive coupling between the power supply conductors and the semiconductor substrate serves to provide a sink for the excess voltages. In this manner, the voltage conducted from the bondpad 31 to the input or output buffer circuitry 34 does not exceed an acceptable level. Various forms of protection devices are described in U.S. Pat. No. 4,821,089, coassigned with the present invention.

However, when diodes are used as the protective device, a problem arises when the bondpad is connected to a signal bus that may operate at a higher voltage than the protected integrated circuit. For example, in some cases it is desirable to power-down a given integrated circuit while the bus to which it is connected remains active. In that case, a high logic level (e.g., +5 volts) may be present on one or more of the bondpads, while the $V_{DD}$ power supply conductor to the powered-down IC is at 0 volts. Therefore, a protective device (e.g., diode 32) could be forward biased, causing a potential electrical overstressing situation, and loading down the bus. In another situation, it is sometimes desirable to use various powering schemes for the integrated circuits on a board (e.g., 5 volts and 3 volts, etc.). If an integrated circuit that operates at the lower level is connected to the bus, then a high-level logic signal could also cause a protective device (diode 32) to conduct, undesirably loading down the bus and overstressing the lower-voltage integrated circuit. Alternatively, transistors may be used as protective devices to provide a higher voltage threshold before conduction occurs, thereby preventing such undesired conduction. However, in some situations, transistors have not provided a sufficiently high degree of protection, due to their higher resistance. In particular, the protection of output buffers from ESD damage has been a problem for workers in the art. Therefore, it is desirable to have an improved technique for protecting integrated circuits from electrostatic discharge that avoids certain problems created by prior art techniques.

SUMMARY OF THE INVENTION

We have invented an improved integrated circuit electrostatic discharge protection technique. A protective device connected between a bondpad and a power supply conductor is designed to highly conduct by forward conduction when a high voltage pulse is applied to the bondpad, but conducts relatively less when normal operating voltages are applied. In an exemplary case, the protective device is a bipolar transistor having its emitter connected to the bondpad and its collector connect to a power supply conductor. The base of the transistor is coupled to the bondpad through a delay means that provides for the requisite high conduction period.

DETAILED DESCRIPTION

Figure 1:
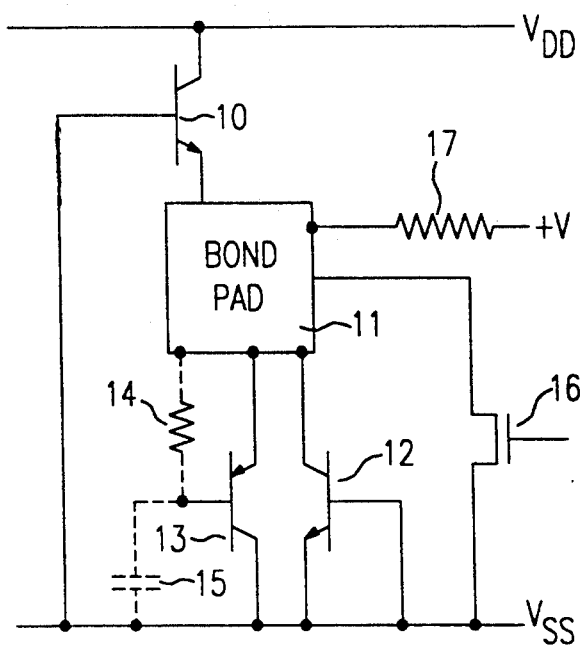
FIG. 1 is a schematic representation of an illustrative embodiment of the invention.

The present detailed description relates to an improved integrated circuit ESD protection technique. Referring to FIG. 1, a bondpad 11 facilitates the connection of the output buffer transistor 16 from the IC chip (or wafer in the case of wafer scale integration) to an integrated circuit package terminal. This allows the integrated circuit to communicate with external circuitry, but also makes it accessible to an ESD event. The output buffer may be of the so-called "open collector" (or "open drain") variety, wherein the pull-up function is provided by an off-chip resistor 17 that is connected to an external positive voltage (+V). If desired, the output transistor may be protected in part by prior-art protection devices. For example, transistor 12 may be included to provide protection, due to the snapback that occurs when high positive voltages appear across the collector-emitter junction. (Transistor 12 also provides protection against negative ESD voltages due to its collector-base junction diode.) In addition, transistor 10 may optionally be included to help protect against voltages that appear between the bondpad and the $V_{DD}$ conductor. Also, the output transistor 16 may be connected through a resistor, typically polysilicon or silicide, to the bondpad 11, for improved ESD protection. However, the present invention provides for protection in addition to, or in lieu of, these prior art techniques.

In the illustrative embodiment of the present invention, the protective device is a pnp bipolar transistor 13 having its emitter connected to the bondpad 11, and its collector connected to the $V_{SS}$ (i.e., ground) power supply conductor. The protective transistor 13 is conductive from emitter to collector, due to forward-bias of its base-emitter junction, during an ESD event, as discussed below, even though its base is also coupled to the bondpad. This is in contrast to prior-art transistors 10 and 12, which typically protect by means of reversebiased effects, usually referred to as "snap-back" effects. (Note that these prior-art transistors also provided base/emitter or base/collector diode forward-bias protection for opposite-polarity ESD voltages, but that did not involve emitter-to-collector conduction.) The resistor 14 is also part of the protective circuitry, and produces an R-C time constant in conjunction with capacitance 15. During a positive-voltage ESD event, this time constant provides for a short delay from the time transistor 13 begins to highly conduct until its conduction is greatly reduced. This short high-conduction period allows the ESD energy to be conducted harmlessly to the $V_{SS}$ conductor, without impairing the normal operation of the input or output circuitry of the integrated circuit.

The operation of the protective circuitry will be more fully explained by the following exemplary sequence:

(1) Prior to the occurrence of an ESD event, the base of transistor 13 assumes the same voltage as bondpad 11, due to conduction through resistor 14. Note that the capacitor 15 will be charged up to whatever voltage difference (if any) exists between bondpad 11 and $V_{SS}$. In the case of an integrated circuit that is not in an operational circuit (e.g., that is in a shipping container), the voltage across capacitor 15 is typically about zero volts.

(2) When a positive ESD voltage is produced at bondpad 11, the voltage on the emitter of protective transistor 13 immediately rises accordingly, due to the direct connection to bondpad 11. However, the voltage at the base of transistor 13 will not rise immediately, due to the delay produced as capacitor 15 is charged up through resistor 14. (An approximate measure of this delay is the R-C time constant of resistor 14 and capacitor 13, considering the base-emitter voltage drop required to produce conduction of transistor 13). Therefore, transistor 13 will momentarily conduct, since the emitter is more positive than the base during this charging period. This conduction will continue until the voltage at the base of transistor 13 rises to a level that causes conduction to cease, which is about 0.6 volts less positive than the voltage on the emitter, in the case of a typical silicon bipolar transistor. During this conduction period, the ESD energy is conducted to the $V_{SS}$ conductor, where it typically dissipates harmlessly. The length of the time delay provided by the R-C time constant, along with the rise-time and fall-time characteristics of a given ESD event, determines the time period during which the protective transistor 13 highly conducts.

During the normal operation of the integrated circuit, the positive operating voltages present at the bondpad 11 (typically less than 10 volts) do not cause protective transistor 13 to become highly conducting. This is in part because the delay due to the R-C time constant is chosen to be short enough that the high conduction period occurs only when very rapidly rising ESD voltages are present. However, the normal operational voltages do not rise so rapidly, and to such a high value, that the emitter-base junction is highly forward biased. For example, we have found that an R-C time constant in the range of 1 to 12 nanoseconds provides for conducting a large current (e.g., 400 milliamps) through transistor 13 when a 2000 volt ESD voltage is applied. A still wider range of R-C time constants is possible, and included herein. However, we recommend that the R-C time constant be at least 100 picoseconds to produce acceptable ESD protection. We also recommend that the R-C time constant be less than 100 nanoseconds to minimize DC current conduction through the protective device, thereby avoiding excessive power dissipation.

Furthermore, the characteristics of the pnp bipolar transistor are chosen so as to not provide for very high conduction when normal operating voltages are present. For example, with the above-noted range of time constants, the conduction through transistor 13 is only about 10 milliamps when operating signals having a pulse duration of 10 nanoseconds are present at the bondpad 11. This conduction is sufficiently small that no significant effects on operation occur when a 100 ohm pull-up resistor 17 is utilized. We recommend that the conduction through the protective transistor is chosen to be less than 0.5, and typically less than 0.1, of the normal operating current that is provided through the bondpad.

Figure 2:
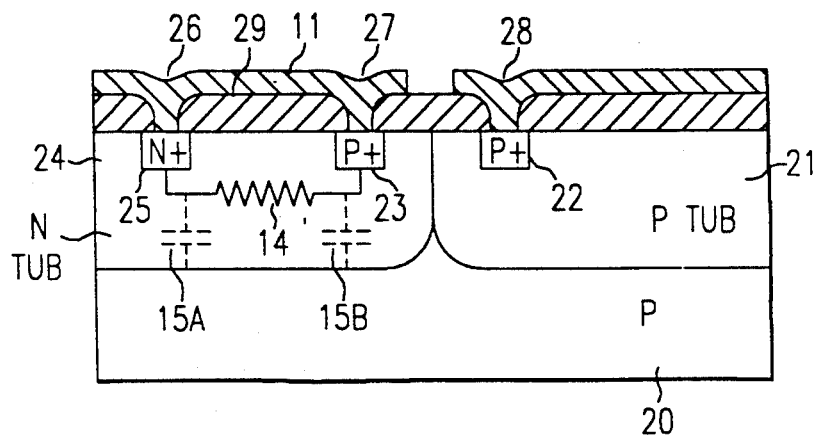
FIG. 2 shows a cross-section of an integrated circuit region that includes a protective device according to the illustrative embodiment of the invention.
Figure 3:
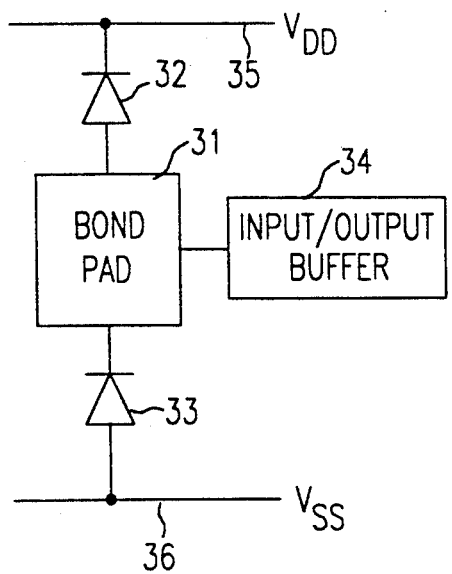
FIG. 3 is a schematic representation of a typical prior art ESD protection technique.

Referring to FIG. 2, an exemplary cross-section view of a semiconductor integrated circuit substrate that implements the present invention is shown. The same identifying numbers as in FIG. 1 are used for comparable elements. In the illustrative case, a n-tub 24 and p-tub 21 are shown as formed in a silicon substrate 20 by a typical twin-tub CMOS process. However, the present technique also applies to single tub designs. The bondpad 11 connects to the n-tub 24 through the window 26 in dielectric region 29 overlying the n+ region 25. Note that the resistance 14 is basically that portion of the n-tub between contact region 25 and the p+ region 23, which serves as the emitter of the protective transistor 13. The base of the protective transistor 13 is essentially the portion of n-tub 24 that lies between the emitter region 23 and the p-tub 21, which serves as the collector of the protective transistor. In addition, the bondpad 11 directly contacts the p+ emitter region 23, through the window 27. The collector of the protective transistor (p-tub region 21) is connected to the negative ($V_{SS}$) power supply conductor 28 via p+ tub-tie region 22. Also shown is the distributed capacitance that forms capacitor 15, which is represented as 15a, and 15b. This capacitance largely results from the junction capacitance from the n-tub 24 and the p-type substrate region 20 in which it is formed, as well as any other stray capacitance that couples to the base of transistor 13.

In an illustrative integrated circuit implemented in 1.25 micrometer technology, the p+ emitter region 23 is spaced about 120 micrometers from the n+ tub-tie region 25, and the width of these regions (extending perpendicular to the plane of FIG. 2) is about 6 micrometers. This provides a value of resistor 14 of about 12 kilohms, when the tub region 24 has a sheet resistivity of 625 ohms per square. For an illustrative n-tub having dimensions of 8 micrometers wide and 100 micrometers, the value of the capacitance 15 is about 1 picofarads. Therefore, the R-C time constant is about 12 nanoseconds. Other R-C time constants may be chosen as desired for a given type of integrated circuit technology. The protective circuitry has been found suitable for protecting input/output buffers against ESD voltages up to at least 1000 volts.

While the illustrative case has shown a bipolar transistor (13) as the protective device, the use of field effect devices is alternatively possible. For example, a p-channel transistor having its source connected to the bondpad and its drain connected to $V_{SS}$ can serve as a protective device. In that case, the gate of the transistor could be connected through a resistor to the bondpad, and the capacitor connected from the gate to $V_{SS}$, or any other fixed reference voltage. However, to avoid large current transients due to floating gate voltages when the power supply voltages are initially applied, the use of bipolar protective devices is presently preferred. In addition, the illustrative case has shown protection for a pull-down output device, wherein an external pull-up resistor is used. Such a resistor typically has a value in the range of 10 to 1000 ohms in current designs, and its use allows for powering-down the integrated circuit without loading down an active signal bus to which it is connected. However, the present invention may also be used for protecting output buffers having an active (e.g., p-channel) pull-up device. The protection of input buffers is also possible with the present technique.

The pnp (or p-channel) devices discussed above are typically used for protection against positive ESD voltages for CMOS devices formed in p-type substrates, in order to obtain the above-noted junction capacitance. However, it is alternately possible to use npn (or n-channel) devices for protection against negative ESD voltages for CMOS devices formed in n-type substrates, in a manner analogous to the foregoing description. In that case, connection to the $V_{DD}$ power supply conductor may typically be made as appropriate in lieu of connection to the $V_{SS}$ conductor. In another embodiment of the invention, the protective pnp transistor 13 may be built entirely within the n-tub, wherein the base is the portion of the n-tub that is located between two p+ regions that serve as the emitter and the collector. The n-tub base region may be either under a field oxide region, or a thin (gate) oxide, with the gate connected to the input/output bondpad.

Note also that while a distributed capacitance, due to the p-n junction capacitance between the tub and the substrate, is shown herein, the use of a discrete on-chip capacitor is alternatively possible. That configuration then allows for a npn transistor to be used in a p-type substrate, or alternatively, a pnp transistor in a n-type substrate. In addition, it allows the capacitor to be connected between the resistor and the base of the protective transistor, if desired. Also, the resistor may be formed from a discrete on-chip device. For example, a doped polysilicon resistor may be used in lieu of the tub resistance shown. That allows for connecting the resistor between the base of the protective transistor and ground, for example. Finally, multiple protective devices having differing R-C delays may be used for still increased protection, allowing for tailoring the current capacity of a given protective device to the expected shape of the ESD waveform. Still other variations of the inventive technique will be apparent to persons of skill in the art.

We claim:

1. An integrated circuit formed in a semiconductor body, and having a conductive bondpad that is coupled to at least one of input or output circuitry, wherein an electrostatic discharge (ESD) protection means is connected to said bondpad for conducting an electric charge from said bondpad to a negative ($V_{SS}$) power supply conductor on said integrated circuit when the positive voltage on said bondpad exceeds a given limit, characterized in that said electrostatic discharge protection means comprises a pnp bipolar transistor having:

an n-type base region located in an n-type tub region that is located in a p-type substrate;

a heavily doped p-type emitter region formed directly in said n-type tub and connected to said bondpad through a conductor formed in a window in an overlying dielectric;

and a p-type collector region that is connected to said negative power supply conductor;

wherein said pnp bipolar transistor has its collector formed in a p-type tub region located adjacent to said n-type tub region in said semiconductor body;

wherein said base is connected to said bondpad by means comprising a heavily doped n-type contact region formed in said n-type tub region;

whereby a delay means is formed comprising a resistance in said n-type tub between said contact region and said emitter, and also comprising a capacitance between said n-type tub and said p-type substrate;

and whereby said bipolar transistor become highly conducting during a positive voltage ESD event, and becomes significantly less conducting when normal operating voltages are applied to said bondpad.

2. The integrated circuit of claim 1 wherein said bipolar transistor becomes highly conducting for a time period that is less than 100 nanoseconds following the beginning of a given ESD event.

3. The integrated circuit of claim 1 wherein said bipolar transistor becomes highly conducting for a time period that is at least 100 picoseconds after the beginning of a given ESD event.

* * * * *